United States Patent
Choi et al.

(10) Patent No.: US 10,856,442 B2
(45) Date of Patent: Dec. 1, 2020

(54) OUTDOOR UNIT OF AIR CONDITIONER, COOLING UNIT APPLIED TO THE OUTDOOR UNIT, AND METHOD FOR MANUFACTURING THE COOLING UNIT

(71) Applicant: SAMSUNG ELECTRONICS CO., LTD., Suwon-si (KR)

(72) Inventors: Kwang Ho Choi, Yongin-si (KR); Wang Byung Chae, Yongin-si (KR); Tae Woo Kang, Suwon-si (KR); Kyo Seung Kim, Seoul (KR); Hyeon U Park, Suwon-si (KR); Ji-Ho Baek, Yongin-si (KR); Sung Hee Lee, Suwon-si (KR); Youn Sang Jang, Cheonan-si (KR); Tae Sung Choi, Suwon-si (KR); Seung Ho Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 346 days.

(21) Appl. No.: 15/298,437

(22) Filed: Oct. 20, 2016

(65) Prior Publication Data
US 2017/0118871 A1    Apr. 27, 2017

(30) Foreign Application Priority Data
Oct. 22, 2015   (KR) .......... 10-2015-0147253

(51) Int. Cl.
*H05K 7/20* (2006.01)
*F24F 1/24* (2011.01)
*B23P 15/26* (2006.01)

(52) U.S. Cl.
CPC .......... *H05K 7/20354* (2013.01); *B23P 15/26* (2013.01); *F24F 1/24* (2013.01); *H05K 7/20318* (2013.01)

(58) Field of Classification Search
CPC ... F24F 1/24; H05D 7/20354; H05K 7/20354; H05K 7/2039; H05K 7/20309; H05K 7/20445; H01L 23/4006; H01L 23/367
See application file for complete search history.

(56) References Cited

U.S. PATENT DOCUMENTS 6,317,328 B1 * 11/2001 Su .................. H01L 23/4006
                                                   165/80.3
2006/0011336 A1   1/2006 Frul
(Continued)

FOREIGN PATENT DOCUMENTS

CN      203258933       10/2013
JP       3920977    *   3/2007 .......... H01L 23/467
(Continued)

OTHER PUBLICATIONS

English translation of JP 3920977 (Year: 2007).*
(Continued)

*Primary Examiner* — Cassey D Bauer
(74) *Attorney, Agent, or Firm* — Staas & Halsey LLP

(57) ABSTRACT

An outdoor unit of an air conditioner having an improved structure to efficiently cool a heating unit of electronic parts therein, a cooling unit applied to the outdoor unit, and a method for manufacturing the cooling unit are provided. The outdoor unit of an air conditioner includes a case, a compressor for compressing a refrigerant, a condenser for condensing a refrigerant discharged from the compressor, electronic parts arranged in the case; and a cooling unit arranged to cool the electronic parts, wherein the cooling unit comprises a heat radiation member arranged to receive and cool down heat produced from the electronic parts, and to come into contact with at least a part of a cooling pipe in which the refrigerant flows, and a plurality of heat transfer fins formed at least some part of the heat radiation member.

13 Claims, 22 Drawing Sheets

(56) References Cited

U.S. PATENT DOCUMENTS

2013/0255932 A1 10/2013 Doepker et al.
2015/0271949 A1* 9/2015 Kim .................. H05K 7/20272
    361/699

FOREIGN PATENT DOCUMENTS

| JP | 2009-144995 | | 7/2009 | |
|----|-------------|---|--------|---|
| KR | 10-2011-0020314 | | 3/2011 | |
| KR | 10-2014-0139803 | | 12/2014 | |
| KR | 10-2014-0144482 | | 12/2014 | |
| KR | 10-2015-0042319 | | 4/2015 | |
| KR | 10-2015-0080833 | | 7/2015 | |
| KR | 10-2014-0121517 | | 10/2017 | |
| WO | WO2013001829 | * | 1/2013 | ............... F24F 1/24 |

OTHER PUBLICATIONS

English translation of WO 2013/001829 (Year: 2013).*
International Search Report dated Dec. 14, 2016 in corresponding International Application No. PCT/KR2016/011687.
Extended European Search Report dated Sep. 18, 2018 in European Patent Application No. 16857743.5.
Chinese Office Action dated Nov. 29, 2019 in Chinese Patent Application No. 201680059699.6.
Chinese Office Action dated Jul. 16, 2020 in Chinese Patent Application No. 201680059699.6.

* cited by examiner

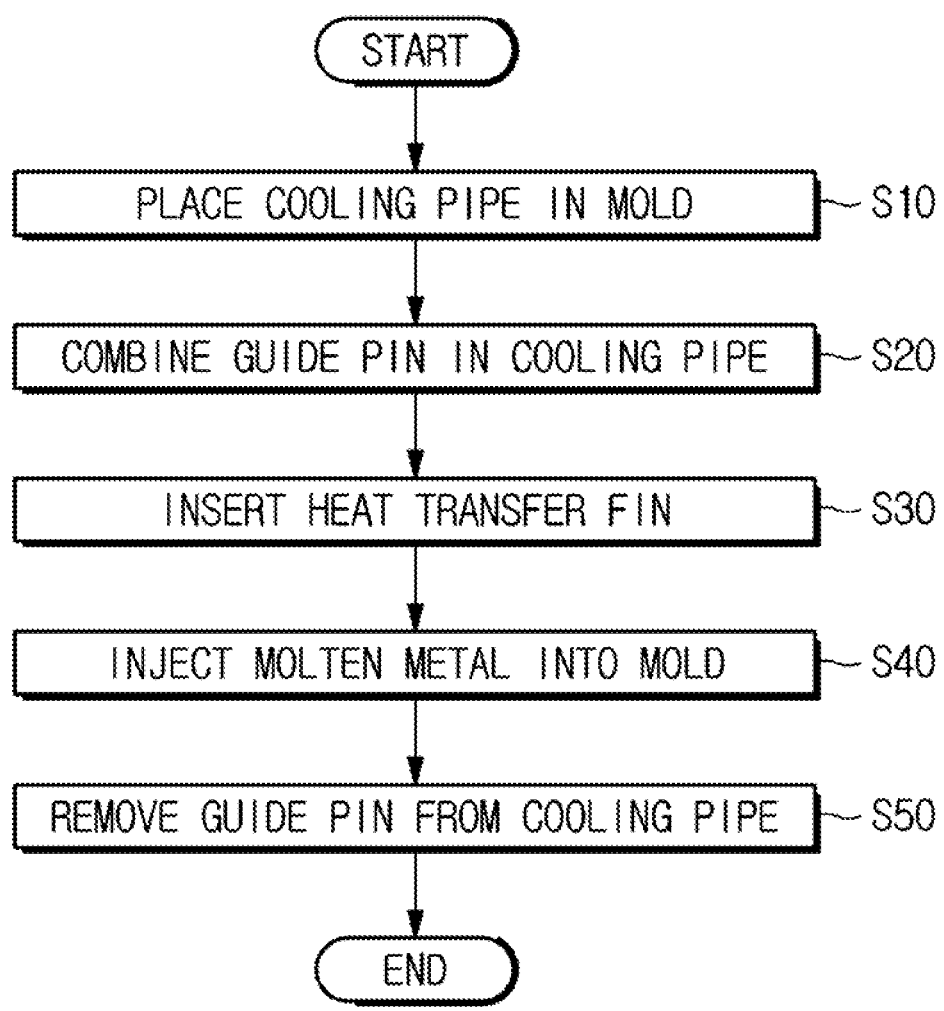

OUTDOOR UNIT OF AIR CONDITIONER, COOLING UNIT APPLIED TO THE OUTDOOR UNIT, AND METHOD FOR MANUFACTURING THE COOLING UNIT

CROSS-REFERENCE TO RELATED APPLICATIONS

This application claims the priority benefit of Korean Application No. 10-2015-0147253, filed Oct. 22, 2015, in the Korean Intellectual Property Office, the disclosure of which is incorporated herein by reference.

BACKGROUND

1. Field

The present disclosure relates to an outdoor unit of an air conditioner having an improved structure to efficiently cool a heating unit of electronic parts therein, a cooling unit applied to the outdoor unit, and a method for manufacturing the cooling unit.

2. Description of the Related Art

In general, air conditioners are devices that use a refrigeration cycle to adjust temperature, humidity, etc., to be favorable for human activities, and at the same time to remove dust from the air. The air conditioner is comprised of an evaporator for cooling the air around the air conditioner by evaporating a refrigerant, a compressor for compressing the refrigerant gas coming out of the evaporator into high temperature and high pressure refrigerant gas, a condenser for condensing the refrigerant gas compressed by the compressor into a room temperature liquid state, and an expansion valve for decompressing the high pressure liquid refrigerant coming out of the condenser.

The air conditioner may be classified into split types and all-in-one types. Among them, the split type air conditioner consists of an indoor unit installed indoors for sucking in indoor air, exchanging heat with a refrigerant, and discharging the heat-exchanged air back to the room, and an outdoor unit for heat-exchanging the refrigerant coming from the indoor unit with the outdoor air to prepare the refrigerant for heat exchange again with the indoor air and supplying the resultant refrigerant to the indoor unit. The compressor and the condenser are commonly installed in the outdoor unit.

In the outdoor unit, a control box including electronic parts to control the outdoor unit is provided. The electronic parts may be heated while at work, and the generation of heat affects the performance of the electronic parts.

Accordingly, cooling devices for cooling the heated electronic parts are provided inside the outdoor unit.

SUMMARY

Additional aspects and/or advantages will be set forth in part in the description which follows and, in part, will be apparent from the description, or may be learned by practice of the invention.

The present disclosure provides an outdoor unit of an air conditioner having an improved structure to efficiently cool a heating part of electronic parts therein and a cooling unit applied to the outdoor unit.

The present disclosure also provides an outdoor unit of an air conditioner having an improved structure to increase heat exchange efficiency by increasing an area of contact between a heat radiation member for cooling the heating unit of the electronic parts and a refrigerant pipe and enabling direct contact between them, and a cooling unit applied to the outdoor unit.

The present disclosure also provides an outdoor unit of an air conditioner and cooling unit applied to the outdoor unit, whereby preventing a decline in cooling efficiency even if flowing of refrigerants decreases, by manufacturing a heat transfer fin for air cooling in a die casting method.

In accordance with an aspect of an exemplary embodiment, there is provided an outdoor unit of an air conditioner comprising a case, a compressor for compressing a refrigerant, a condenser for condensing a refrigerant discharged from the compressor, electronic parts arranged in the case; and a cooling unit arranged to cool the electronic parts, wherein the cooling unit comprises a heat radiation member arranged to receive and cool down heat produced from the electronic parts, and to come into contact with at least a part of a cooling pipe in which the refrigerant flows; and a plurality of heat transfer fins formed at least some part of the heat radiation member.

The heat transfer fin may be inserted into the heat radiation member in an insert die casting method.

The heat radiation member comprises a first cooling unit coming into face-to-face contact with a heating unit for the electronic parts, and a second cooling unit formed integrally with the first cooling unit and transferring heat to the cooling pipe inside the second cooling unit.

The cooling pipe may be entirely or partly inserted into the heat radiation member in a die casting method.

The cooling pipe comprises at least one of copper (Cu), aluminum (Al), and iron (Fe).

The heat radiation member comprises at least one of aluminum (Al) and an aluminum alloy.

The outdoor unit may include an expansion valve for expanding the refrigerant condensed by the condenser, wherein the refrigerant passes through at least one of the condenser and the expansion valve.

The heat transfer fin may be formed integrally with the heat radiation member.

The heat transfer fin may include at least one of copper (Cu), aluminum (Al), and iron (Fe).

The heat transfer fin may be combined with the heat radiation member in an ultrasonic fusion method.

According to another aspect of the present disclosure, a method for manufacturing a cooling unit, the method comprises: arranging a cooling pipe inside a die casting mold; combining a guide pin into the cooling pipe; forming a heat radiation member with the cooling pipe insert-die-casted therein by injecting a molten metal into the die casting mold.

The molten metal comprises one of aluminum or aluminum alloy.

The heat radiation member has at least a part where a plurality of heat transfer fins are manufactured in a die casting method.

The cooling pipe is die-casted to enclose all or part of the heat radiation member.

The cooling pipe comprises at least one of copper Cu, aluminum Al, and iron Fe.

The heat radiation member further comprises at least one or more heat transfer fins, and wherein the heat transfer fin is manufactured in an insert die casting method by insertion or ultrasonic fusion into the heat radiation member.

The heat transfer fin comprises at least one of copper Cu, aluminum Al, and iron Fe.

According to another aspect of the present disclosure, an outdoor unit of an air conditioner includes a case, a compressor for compressing a refrigerant; a condenser for condensing a refrigerant discharged from the compressor, electronic parts arranged in the case, and a cooling unit arranged to cool a heating unit for the electronic parts, wherein the cooling unit comprises a first cooling unit formed in die casting to come into contact with the heating unit, a second cooling unit formed integrally with the first cooling unit and having a cooling pipe formed for the refrigerant to flow therein manufactured in an insert die casting method inside the first cooling unit, and a plurality of heat transfer fins combined with the second cooling unit in at least one of die casting and insertion or ultrasonic fusion methods.

The heat transfer fin include at least one of copper (Cu), aluminum (Al), and iron (Fe).

The cooling pipe may be die-casted to enclose all or part of the heat radiation member.

BRIEF DESCRIPTION OF THE DRAWINGS

These and/or other aspects and advantages will become apparent and more readily appreciated from the following description of the embodiments, taken in conjunction with the accompanying drawings.

FIG. 6 is a flowchart schematically illustrating a method for manufacturing a cooling unit, according to an embodiment of the present disclosure.

DETAILED DESCRIPTION

Figure 1:
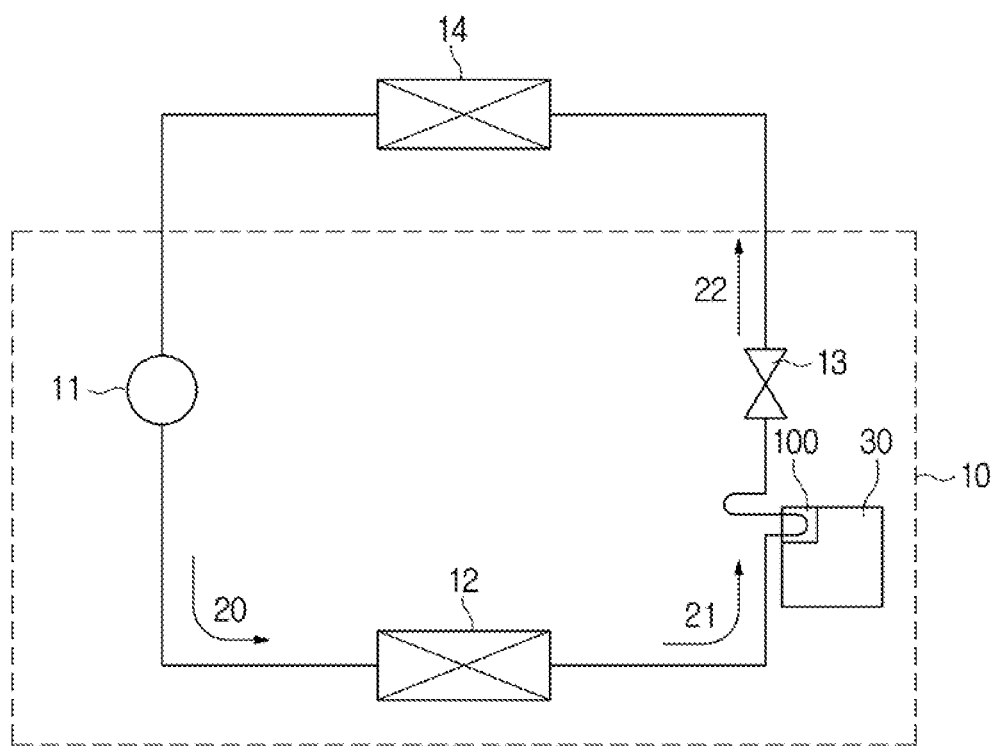
FIG. 1 shows a refrigeration cycle of an air conditioner that includes a cooling unit, according to an embodiment of the present disclosure.

Reference will now be made in detail to the embodiments, examples of which are illustrated in the accompanying drawings, wherein like reference numerals refer to the like elements throughout. The embodiments are described below to explain the present invention by referring to the figures.

Embodiments and features as described and illustrated in the present disclosure are only preferred examples, and various modifications thereof may also fall within the scope of the disclosure.

Throughout the drawings, like reference numerals refer to like parts or components.

The terminology used herein is for the purpose of describing particular embodiments only and is not intended to limit the present disclosure. It is to be understood that the singular forms "a," "an," and "the" include plural references unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the present disclosure. Descriptions shall be understood as to include any and all combinations of one or more of the associated listed items when the items are described by using the conjunctive term "~ and/or ~," or the like.

Reference will now be made in detail to embodiments, examples of which are illustrated in the accompanying drawings, wherein like reference numerals refer to the like elements throughout.

FIG. 1 shows a refrigeration cycle of an air conditioner that includes a cooling unit, according to an embodiment of the present disclosure.

Referring to FIG. 1, a refrigeration cycle of an air conditioner 1 may include a compressor 11, a condenser 12, an expansion valve 13, and an evaporator 14. The refrigeration cycle circulates a series of processes of compression, condensing, expansion, and evaporation, enabling heat exchange between high temperature air and low temperature refrigerants and thus supplying the cooled air into the room.

The compressor 11 compresses a refrigerant gas 20 into a high pressure state, and discharges the resultant gas refrigerant 20, which flows into the condenser 12. The condenser 12 condenses the compressed gas refrigerant into a liquid, releasing heat to the surroundings in the condensing process. While being condensed by the condenser 12, the refrigerant drops to a low temperature.

The expansion valve 13 expands a high pressure and high temperature liquid refrigerant 22 condensed by the condenser 12 to a low pressure liquid refrigerant 22. The evaporator 14 evaporates the refrigerant expanded by the expansion valve 13. The evaporator 14 attains cooling effect by exchanging heat with an object to be cooled using latent heat of vaporization of the refrigerant, and forces the low temperature and low pressure refrigerant gas to return to the compressor 11. Conditioned air through this refrigeration cycle may be supplied into the room.

An outdoor unit 10, e.g., outdoor portion of the air conditioner 1 may include the compressor 11 and condenser 12 in the refrigeration cycle. The expansion valve 13 may be located in one of an indoor unit, e.g., indoor portion (not shown) or the outdoor unit 10, and the evaporator 14 may be located in the indoor unit.

A cooling unit 100, e.g. cooler may be installed between the condenser 12 and the expansion valve 13 for the refrigerant that has passed the condenser 12 to flow in thereto. While the cooling unit 100 is shown to be installed between the condenser and the expansion valve for the refrigerant that has passed the condenser to flow in thereto in an embodiment of the present disclosure, it is not limited thereto. For example, the cooling unit may be arranged between the expansion valve and the evaporator as well for the refrigerant that has passed the expansion valve to flow in thereto.

Figure 2:
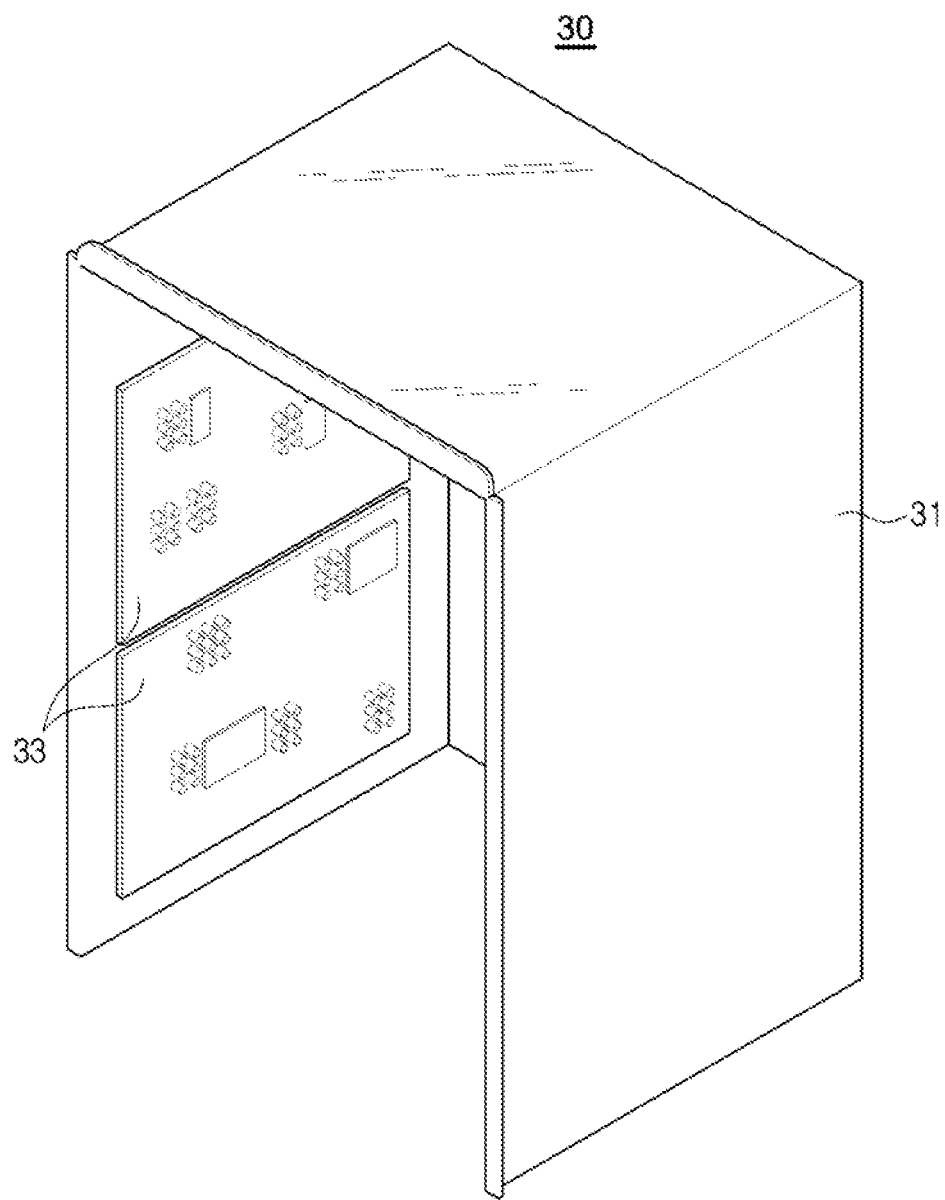
FIG. 2 is a perspective view illustrating a control box of an air conditioner, according to an embodiment of the present disclosure.
Figure 3:
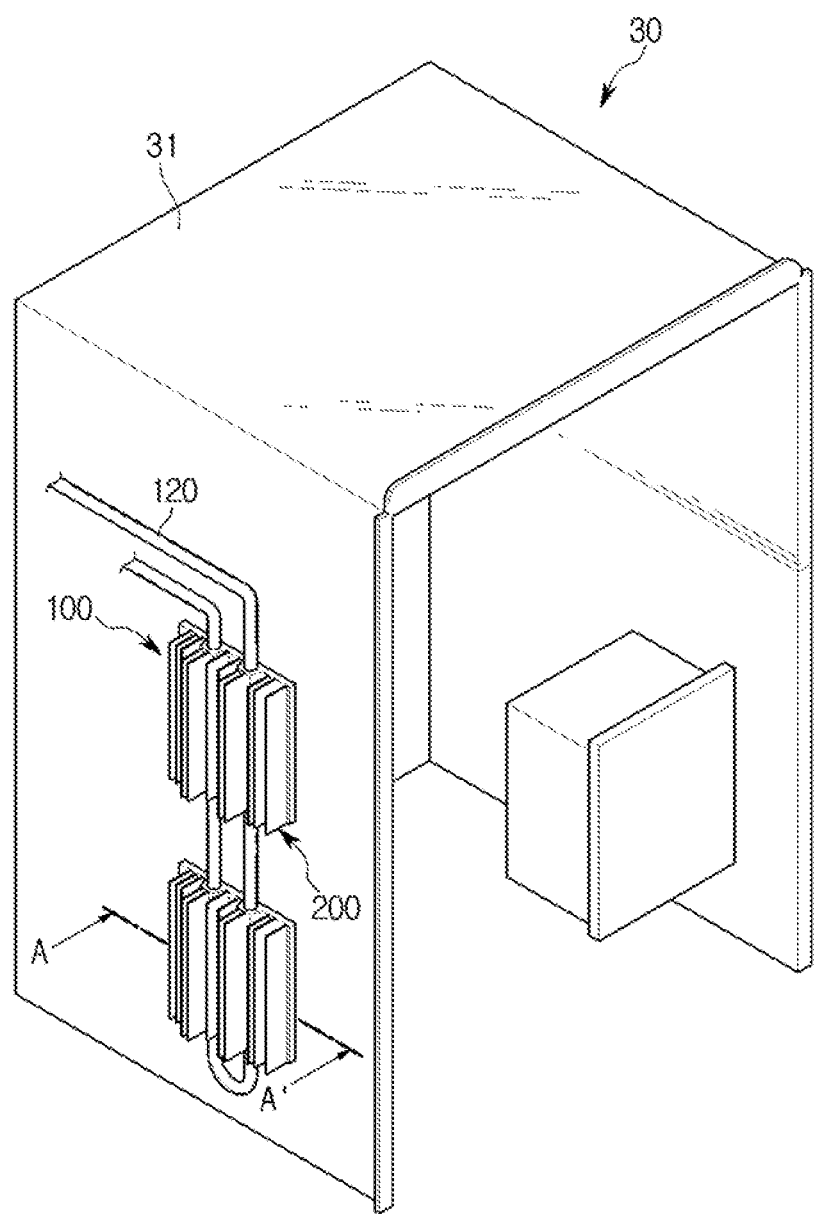
FIG. 3 is a perspective view illustrating a control box in which a cooling unit is installed, according to an embodiment of the present disclosure.

FIG. 2 is a perspective view illustrating a control box of an air conditioner, according to an embodiment of the present disclosure, and FIG. 3 is a perspective view illustrating a control box in which a cooling unit is installed, according to an embodiment of the present disclosure.

As illustrated, for example, in FIGS. 2-3, the outdoor unit 10 of the air conditioner may include a control box 30. The control box 30 may be configured to control operation of the outdoor unit 10 of the air conditioner.

The control box 30 may include a case 31 and electronic parts 33.

The case 31 may be located on an internal side of the outdoor unit 10 of the air conditioner. The case 31 may partition off a space where the electronic parts 33 are placed from the outdoor unit 10 of the air conditioner.

The electronic parts 33 may be mounted in the case 31. The electronic parts 33 may be mounted on one inner side wall of the case 31. The electronic parts 33 may include a printed circuit board on which circuit devices are mounted. The electronic parts 33 may include an inverter controller, EMI, reactor, etc. The inverter controller may control the compressor 11 to be driven at high speed or low speed, according to conditions of the room where the air conditioner 1 is installed, or according to manipulation of the user.

The electronic parts 33 may be heated while the air conditioner is operating. With recent advancement of technology, the electronic parts 33 are playing more roles. Accordingly, the electronic parts 33 consume more power, thereby producing more heat.

The electronic parts 33 may be disabled or malfunction due to the heat. Furthermore, the temperature rise due to the heat produced in the electronic parts 33 may shorten life spans of the electronic parts 33 and cause degradation of the performance of the electronic parts 53. To prevent this, the cooling unit 100 may be installed to cool the electronic parts 33.

The cooling unit 100 may cool a heating unit 34, e.g. heater located inside the outdoor unit 10 of the air conditioner 1. The cooling unit 100 may be arranged to come into direct contact with the heating unit 34 to exchange heat. The heating unit 34 may be cooled by transferring the heat of the heating unit 34 to the cooling unit 100. The heating unit 34 may correspond to a heating unit 34 for the electronic parts 33 located inside the control box 30. An example where the cooling unit 100 cools the heating unit 34 for the electronic parts 33 is described.

The cooling unit 100 may be installed on the outer side of the control box 30. The cooling unit 100 may pass through the control box 30 to come into contact with the heating unit 34 for the electronic parts 33. The cooling unit 100 may be installed to be detached from the control box 30.

Figure 4:
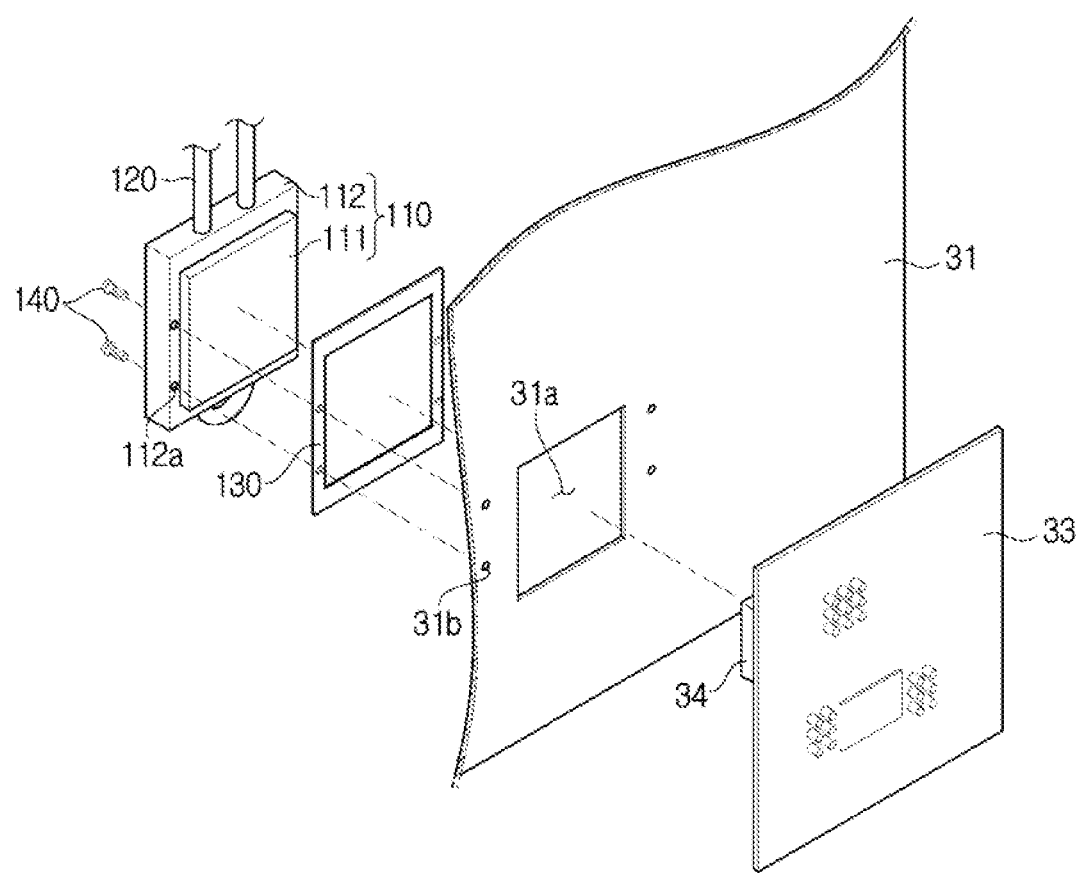
FIG. 4 is an exploded view of a cooling unit installed in a control box, according to an embodiment of the present disclosure.
Figure 5:
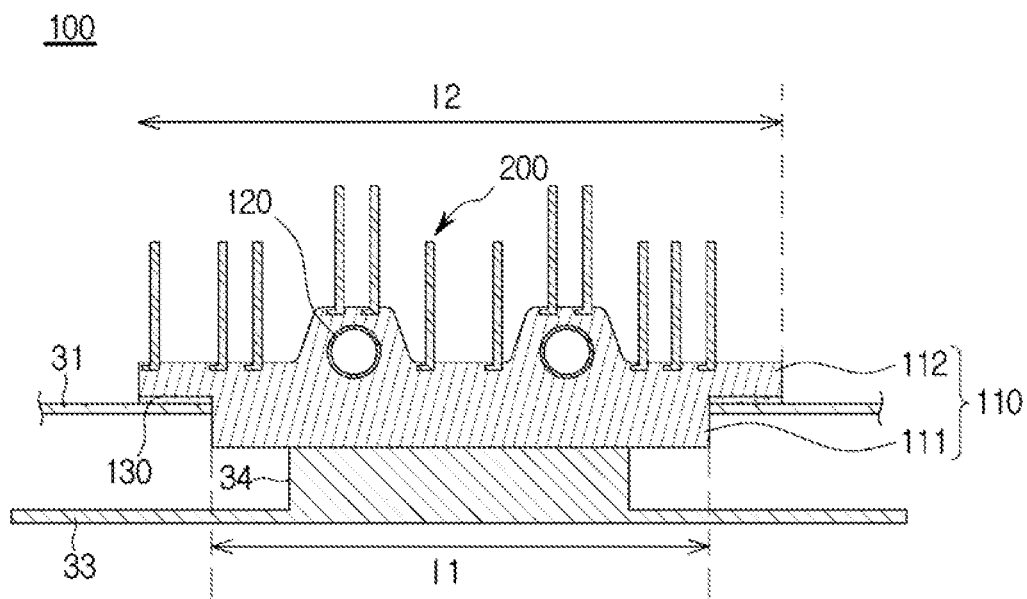
FIG. 5 is a cross-sectional view along line A-A' of FIG. 3.

FIG. 4 is an exploded view of a cooling unit installed in a control box, according to an embodiment of the present disclosure, and FIG. 5 is a cross-sectional view along line A-A' of FIG. 3.

As shown in FIGS. 4 and 5, the cooling unit 100 may be detachably coupled with the case 31 of the control box 30 through coupling members 140.

A via hole 31a may be formed in the case 31 of the control box 30 for the cooling unit 100 to be installed therein to be able to come into contact. The via hole 31a may be formed by boring through at least a part of the case 31. The via hole 31a may be formed to have a size corresponding to the heating unit 34 for the electronic parts 33.

Installers 31b for the coupling member 140 to be installed therein to detachably install the cooling unit 100 may be formed in the case 31. The installers 31b may be formed to have the size and number to correspond to the coupling members 140 to install the cooling unit 100.

The cooling unit 100 may include a heat radiation member 110, a cooling pipe 120, and a heat transfer fin 200.

The heat radiation member 110 may have at least one side to come into direct contact with the heating unit 34 for the electronic parts 33. The heat radiation member 110 may be installed outside of the control box 30, and may bore through the control box 30 to come into contact with the heating unit 34 inside the control box 30.

The heat radiation member 110 may include a first cooling unit 111, e.g. first cooler and a second cooling unit 112, e.g. second cooler.

The first and second cooling units 111 and 112, e.g., coolers of the heat radiation member 110 are members that may form a single body by being manufactured into one unit.

The heat radiation member 110 may include at least one of aluminum (Al) and aluminum alloy.

The first cooling unit 111 of the heat radiation member 110 may be arranged to make face-to-face contact with the heating unit 34. The second cooling unit 112 may be integrally formed with the first cooling unit 111, and may have at least one cooling pipe 120 in which the refrigerant flows arranged therein.

The second cooling unit 112 may be located outside of the control box 30. The second cooling unit 112 may be detachably combined onto the outer side of the control box 30. The second cooling unit 112 may include combining holes 112a formed for combination with the control box 30 through the combining members 140. The combining holes 112a of the second cooling unit 112 may be formed in an area not overlapping with the first cooling unit 111. The second cooling unit 112 may be detachably installed at the case 31 of the control box 30 by the combining members 140 passing through the combining holes 112a.

The cooling pipe 120 may be inserted into the second cooling unit 112. The second cooling unit 112 is formed to come into contact with the cooling pipe 120 in which the refrigerant flows to proceed heat exchange.

The cooling pipe 120 may include at least one of copper (Cu), Aluminum (Al), and iron (Fe).

The first cooling unit 111 may be mounted on one side of the second cooling unit 112. The first cooling unit 111 may extend inward of the control box 30 from the second cooling unit 112. The first cooling unit 111 may pass through the via hole 31a of the case 31 and come into contact with the heating unit 34.

The length 11 of the first cooling unit 111 may be smaller than the length 12 of the second cooling unit 112. That is, the first cooling unit 111 may be formed to be smaller in size than the second cooling unit 112.

The first cooling unit 111 may have the size and shape corresponding to the via hole 31a so as to be inserted into the via hole 31a of the case 31.

The first cooling unit 111 may exchanges heat with the heating unit 34 located inside of the control box 30 through direct contact. The first cooling unit 111 may have a lower temperature than that of the heating unit 34 due to the cooling pipe 120 coming into contact with the second cooling unit 112. Accordingly, the heating unit 34 may be cooled by transferring heat to the first cooling unit 111.

The cooling pipe 120 may come into contact and thus exchange heat with the heat radiation member 110. The cooling pipe 120 may extend through the inside of the heat radiation member 110. This may increase an area of contact between the cooling pipe 120 and the heat radiation member 110. Accordingly, the efficiency of heat exchange between the cooling pipe 120 and the heat radiation member 110 may be improved.

The cooling pipe 120 may be formed for a refrigerant to flow therein. The refrigerant may include a liquid with a lower temperature than the heating unit 34. The refrigerant may receive heat from the heat radiation member 110 and the heated refrigerant may circulate through the cooling pipe 120. This may keep the heat radiation member 110 at a constant temperature.

The cooling pipe 120 may be formed for the liquid refrigerant 21 condensed by the condenser 12 to move therein. The high temperature and high pressure refrigerant 20 drops to a low temperature while being condensed by the condenser 12. The low temperature liquid refrigerant 21 that has passed the condenser 12 may move to the cooling unit 100. The cooling unit 100 may cool the heating unit 34 with the low temperature liquid refrigerant 21.

The cooling pipe 120 may be formed for a low temperature and low pressure refrigerant 22 expanded by the expansion valve 13 to move therein. Although not shown, the low temperature and low pressure refrigerant 22 that has passed the expansion valve 13 may flow to the cooling unit 100. The cooling unit 100 may cool the heating unit 34 with the low temperature and low pressure refrigerant 22.

The cooling unit 100 may include the heat radiation member 110, the cooling pipe 120, and the heat transfer fin 200.

The heat transfer fin 200 may be manufactured in an insert die casting method in the heat radiation member 110. The heat transfer fin 200 may be arranged in the second cooling unit 112 of the heat radiation member 110. The heat transfer fin 200 may be inserted into the second cooling unit 112 of the heat radiation member 110. There may be a plurality of heat transfer fins 200. The heat transfer fin 200 may be formed of the same material as the second cooling unit 112. The heat transfer fin 200 may include at least one of copper (Cu), Aluminum (Al), and iron (Fe).

The heat transfer fin 200 may be formed integrally with the heat radiation member 110 in a way that the plurality of heat transfer fins 200 are inserted in the process of die casting manufacturing of the heat radiation member 110.

The heat transfer fin 200 may be placed on the other side of the second cooling unit 112, i.e., at a position opposite to the first cooling unit 111. The heat transfer fin 200 may be formed to exchange heat with air. The heat transfer fin 200 may be arranged on the outside of the case 31.

Accordingly, even when the refrigerant flows less in the cooling pipe 120 in the second cooling unit 112 of the heat radiation member 110, cooling may be performed through air cooling by the plurality of heat transfer fins 200 arranged in the second cooling unit 112.

There may be a sealing member 130 arranged between the first cooling unit 111 and the case 31. The sealing member 130 may prevent foreign materials, such as rainwater from moving between the second cooling unit 112 and the case 31 by sealing the gap between the second cooling unit 112 and the case 31.

Figure 7A:
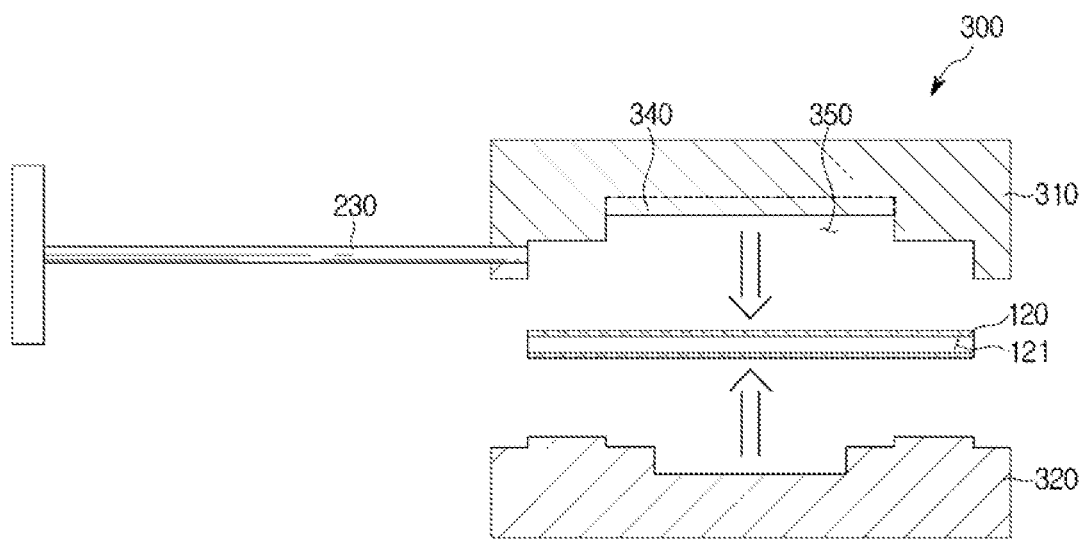
FIGS. 7A-7C and 8A-8C show procedures of manufacturing a cooling unit, according to an embodiment of the present disclosure.
Figure 7B:
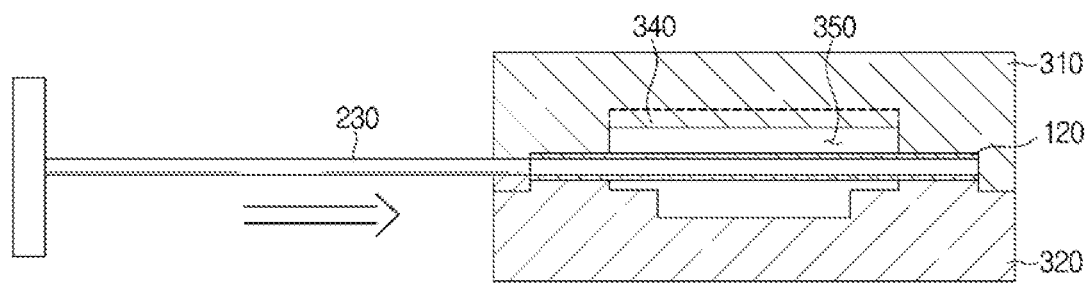
Figure 7C:
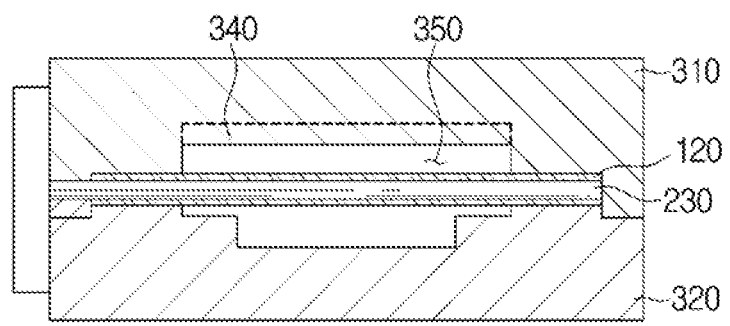
Figure 8A:
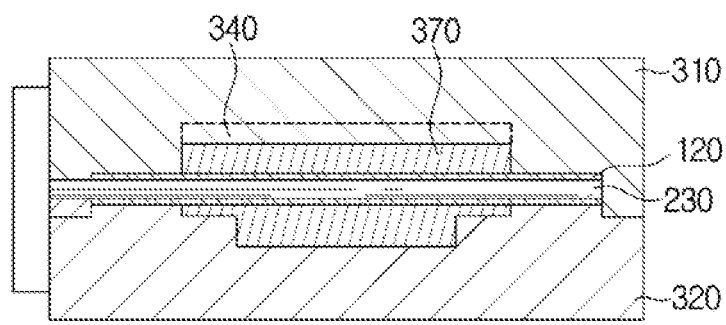
Figure 8B:
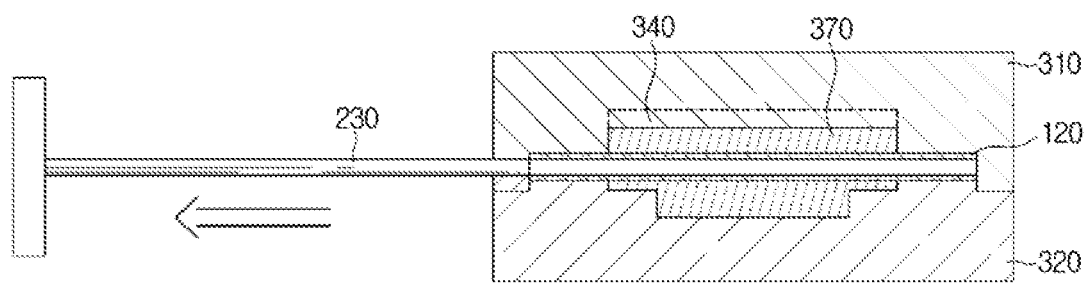
Figure 8C:
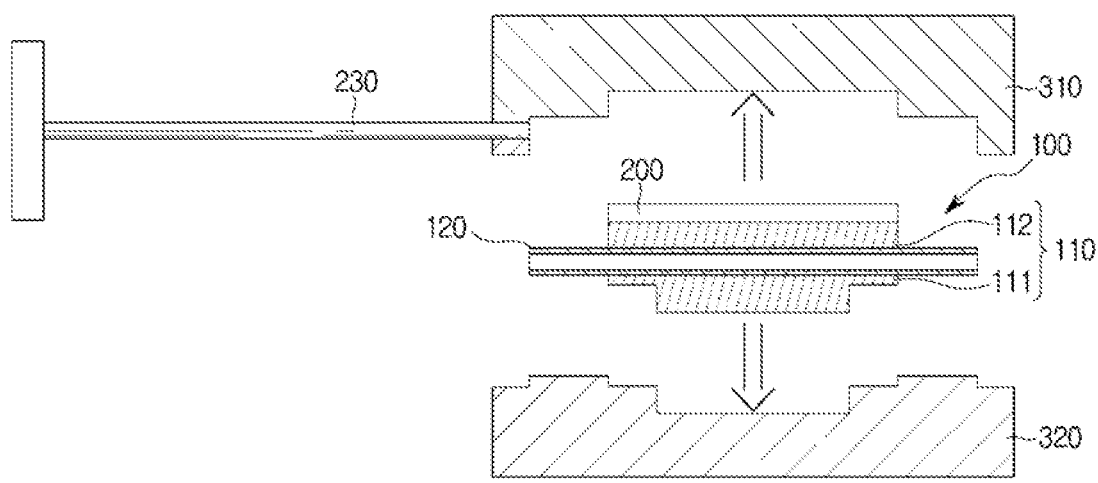

FIG. 6 is a flowchart schematically illustrating a method for manufacturing a cooling unit, according to an embodiment of the present disclosure, and FIGS. 7 and 8 show procedures of manufacturing a cooling unit, according to an embodiment of the present disclosure.

Referring to FIG. 6, a method for manufacturing the cooling unit 100 is schematically described.

The method for manufacturing the cooling unit 100 includes placing a cooling pipe 120 inside a die casting mold 300, in S10, combining a guide pin 230 inside the cooling pipe 120, in S20, inserting the heat transfer fin 200 into the die casting mold 300, in S30, injecting a molten metal into the die casting mold 300, in S40, and removing the guide pin 230 from the cooling pipe 120, in S50.

As shown in FIGS. 7A-7C to 8A-8C, the die casting mold 300 may include an upper mold 310 and a lower mold 320. The upper mold 310 and the lower mold 320 are combined together to form a cavity 350 therein.

In the cavity 350, a former 340 may be formed to reserve for the heat transfer fin 200. While the former 340 is formed in the upper mold 310 in an embodiment of the present disclosure, it is not limited thereto. For example, the former 340 may be formed in the lower mold 320 as well.

The cooling pipe 120 may be arranged such that at least a part of the cooling pipe 120 is located in the cavity 350 formed by the combination of the upper mold 310 and the lower mold 320, in S10.

Arranging the at least a part of the cooling pipe 120 in the cavity 350 to be formed integrally with the cooling unit 100 may make the cooling pipe 120 protrude to either side of the cooling unit 100, thereby securing weldability with a counterpart pipe (not shown) for connection and thus increasing the possibility of mass production.

Once the cooling pipe 120 is arranged in the cavity 350, the guide pin 230 is combined inside the cooling pipe 120, in S20. The guide pin 230 may be combined in an internal fluid path 121 inside the cooling pipe 120. This may prevent deformation and damage to the cooling pipe 120 due to a high temperature molten metal 370 being injected into the cavity 350.

The guide pin 230 may be formed of a metal substance. The guide pin 230 may be formed of a metal having a higher melting point than the cooling pipe 120 formed to have at least one of copper (Cu), aluminum (Al), and iron (Fe).

The guide pin 230 may be formed to be inserted into the internal fluid path 121 of the cooling pipe 120. The guide pin 230 may be formed to have the same or smaller cross-section than that of the internal fluid path 121 of the cooling pipe 120.

Once the guide pin 230 is combined inside the cooling pipe 120, the heat transfer fin 200 is inserted into the former 340 of the cavity 350, in S30.

Although in an embodiment of the present disclosure, the heat transfer fin 200 is placed after the cooling pipe 120 is placed in the cavity 350 of the die casting mold 300 and the guide pin 230 is inserted to the inside 121 of the cooling pipe 120, it is not limited thereto. For example, the heat transfer fin 200 may be inserted into the cavity 350 after the step S10 of insertion of the cooling pipe 120. For example, the heat transfer fin 200 may be inserted into the cavity 350 at the same time as in step S10 of insertion of the cooling pipe 120.

Once the guide pin 230 is combined inside the cooling pipe 120 in the die casting mold 300, the molten metal 370 is injected into the cavity 350 of a form that encloses at least a part of the cooling pipe 120, in S40.

The molten metal 370 to be injected into the cavity 350 may have temperature of about 600° C. to about 700° C. The molten metal 370 may include at least one of aluminum (Al) and an aluminum alloy.

Once the molten metal 370 is injected into the die casting mold 300, the guide pin 230 is removed from the inside of the cooling pipe 120, in S50. That is, once the molten metal 370 is completely injected into the cavity 350, the guide pin 230 may be removed.

In this regard, the guide pin 230 may be removed while the cooling pipe 120 is not deformed or damaged due to the molten metal 370 injected to the cavity 350.

Once the guide pin 230 is removed from the cooling pipe 120, the manufactured cooling unit 100 may be separated from the die casting mold 300.

The cooling unit 100 may be manufactured in a form that includes the heat radiation member 110 of a form with the cooling pipe 120 formed by solidifying the molten metal 370 inserted into the heat radiation member 110, and the heat transfer fin 200 formed on one side of the heat radiation member 110.

As described above, since the cooling pipe 120 is formed by being inserted into the heat radiation member 110, it may increase an area of contact between the heat radiation member 110 and the cooling pipe 120, thereby increasing heat exchange efficiency between the refrigerant and the heat radiation member 110. At the same time, air cooling may be achieved by the heat transfer fin 200 arranged on the one side of the heat radiation member 110.

Accordingly, even if the refrigerant flows less in the cooling pipe 120, cooling is performed through the air cooling by the plurality of heat transfer fins 200, which may, in turn, cool down the heating unit 34, thereby increasing the cooling efficiency.

Although in the embodiment of the present disclosure, a straight part of the streamlined cooling pipe is insert-die-casted with the heat radiation member, it is not limited thereto. For example, it is also possible for a plurality of straight parts of the cooling pipe to be insert-die-casted in multitudes.

Figure 9:
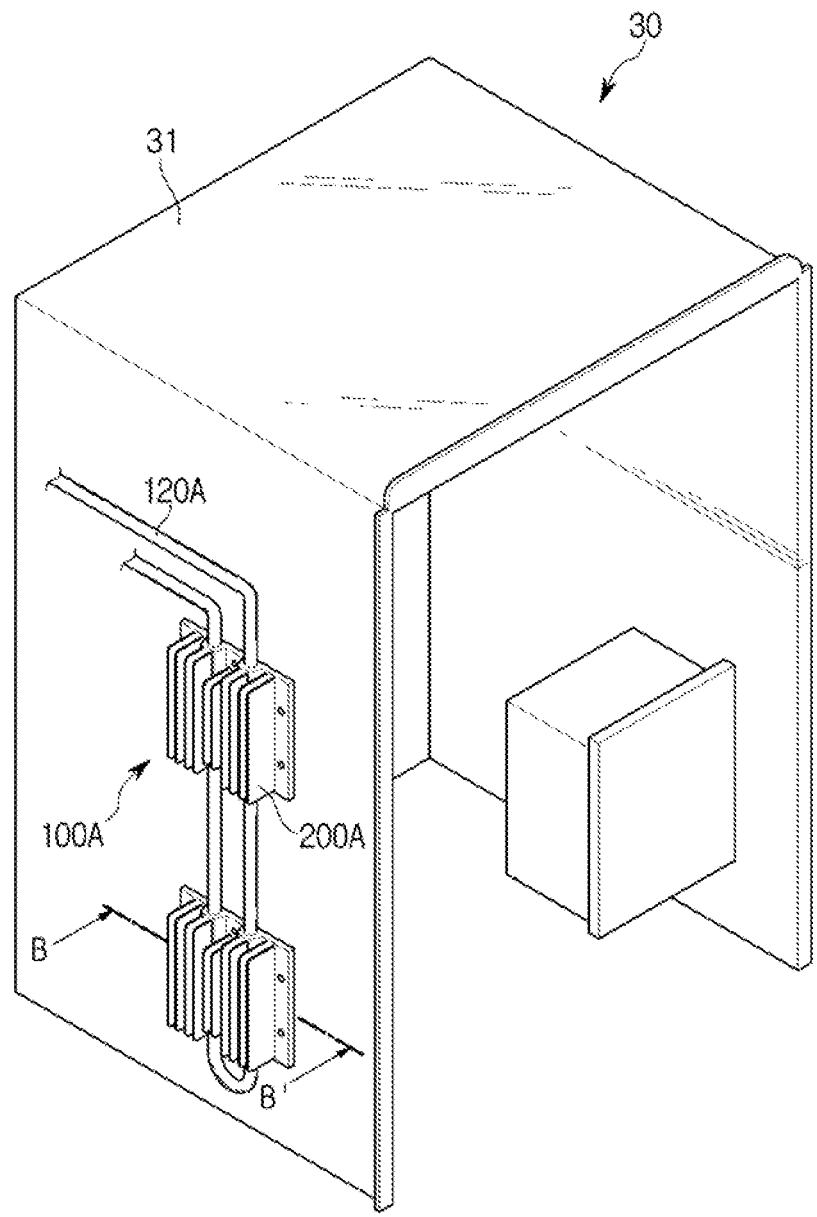
FIG. 9 is a perspective view illustrating a control box in which a cooling unit is installed, according to another embodiment of the present disclosure.
Figure 10:
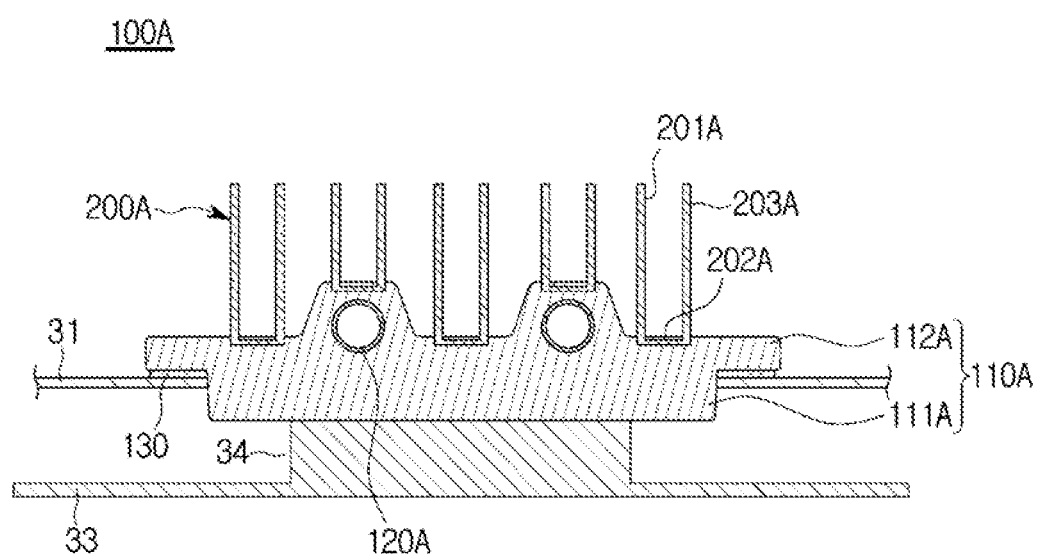
FIG. 10 is a cross-sectional view along line B-B' of FIG. 9.

FIG. 9 is a perspective view illustrating a control box in which a cooling unit is installed, according to another embodiment of the present disclosure, and FIG. 10 is a cross-sectional view along line B-B'. Reference numerals not shown in FIGS. 9 and 10 may be referred to from FIGS. 1 to 8.

As shown in FIGS. 9 and 10, the cooling unit 100 may include a heat radiation member 110A, a cooling pipe 120A, and a heat transfer fin 200A.

The heat transfer fin 200A may be manufactured in the insert die casting method in the heat radiation member 110A.

The heat transfer fin 200A may be arranged in the second cooling unit 112A of the heat radiation member 110A. The heat transfer fin 200A may be inserted into the second cooling unit 112A of the heat radiation member 110A. There may be a plurality of heat transfer fins 200A. The heat transfer fin 200A may be formed of the same material as the second cooling unit 112A. The heat transfer fin 200A may include at least one of copper (Cu), Aluminum (Al), and iron (Fe).

The plurality of heat transfer fins 200A may be formed in pairs of two. The heat transfer fin 200A may include a first fin 201A, a second fin 203A, and a connector 202A connected between the first fin 201A and the second fin 203A.

The first fin 201A and the second fin 203A may be equally long. The connector 202A is formed to connect the bottom ends of the first fin 201A and second fin 203A. The connector 202A may be insert-die-casted in the second cooling unit 112A of the heat radiation member 110A. Although in the embodiment of the present disclosure, the heat transfer fin is insert-die-casted in the heat radiation member, it is not limited thereto. For example, the heat transfer fin may be combined in the heat radiation member in an ultrasonic fusion method as well.

The heat transfer fin 200A may be placed on the other side of the second cooling unit 112A, i.e., at a position opposite to the first cooling unit 111A. The heat transfer fin 200A may be arranged on the outside of the case 31. The heat transfer fin 200A is formed to exchange heat with air.

Accordingly, even when the refrigerant flows less in the cooling pipe 120A in the second cooling unit 112A of the heat radiation member 110A, cooling may be performed through air cooling by the plurality of heat transfer fins 200A arranged in the second cooling unit 112A.

The manufacturing procedure of the cooling unit 100A that has the heat transfer fin 200A formed to include the second fin 203A connected to the second fin 203A by a connector 202A and the cooling pipe 120A inserted into the heat radiation member 110A is the same for the cooling unit 110 in the embodiment as described above, so the description will be omitted herein.

Although in the embodiment of the present disclosure, the heat transfer fins are equally long, they are not limited thereto. For example, the plurality of heat transfer fins may be formed to have different lengths.

Figure 11:
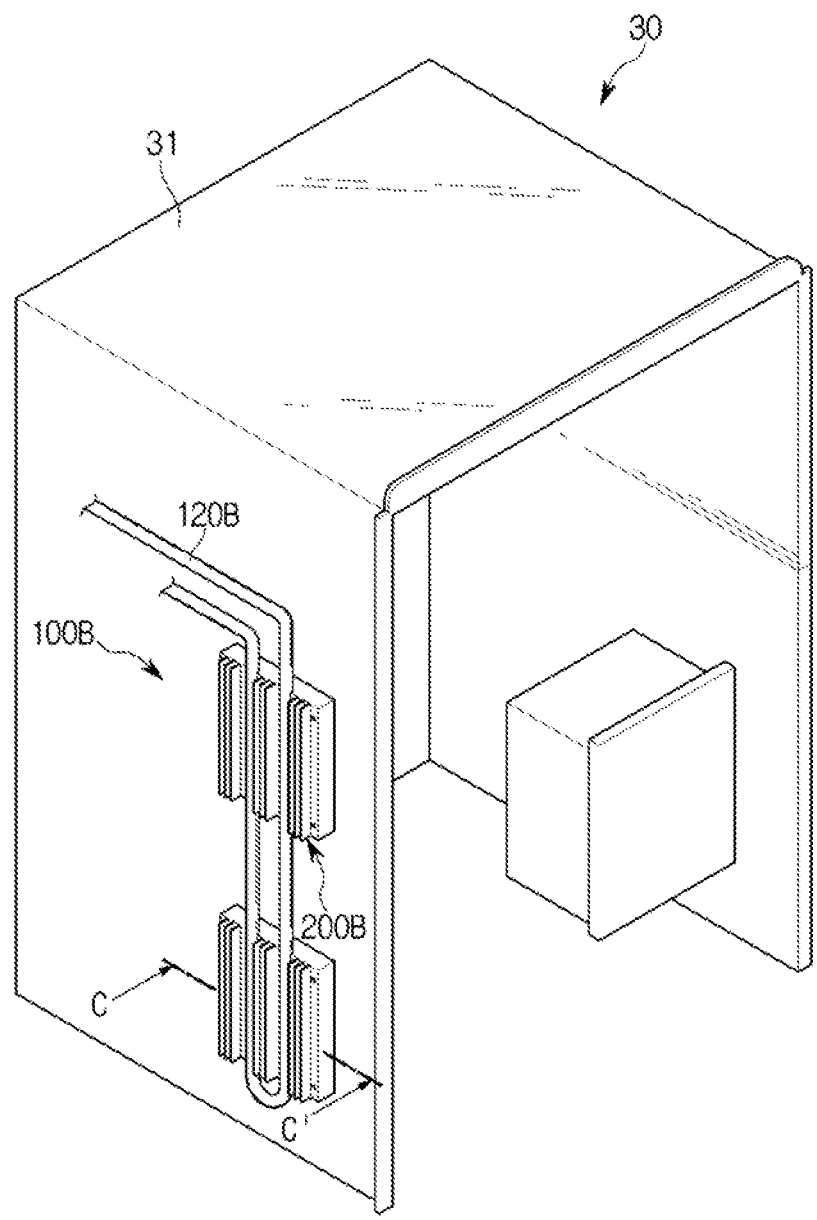
FIG. 11 is a perspective view illustrating a control box in which a cooling unit is installed, according to another embodiment of the present disclosure.
Figure 12:
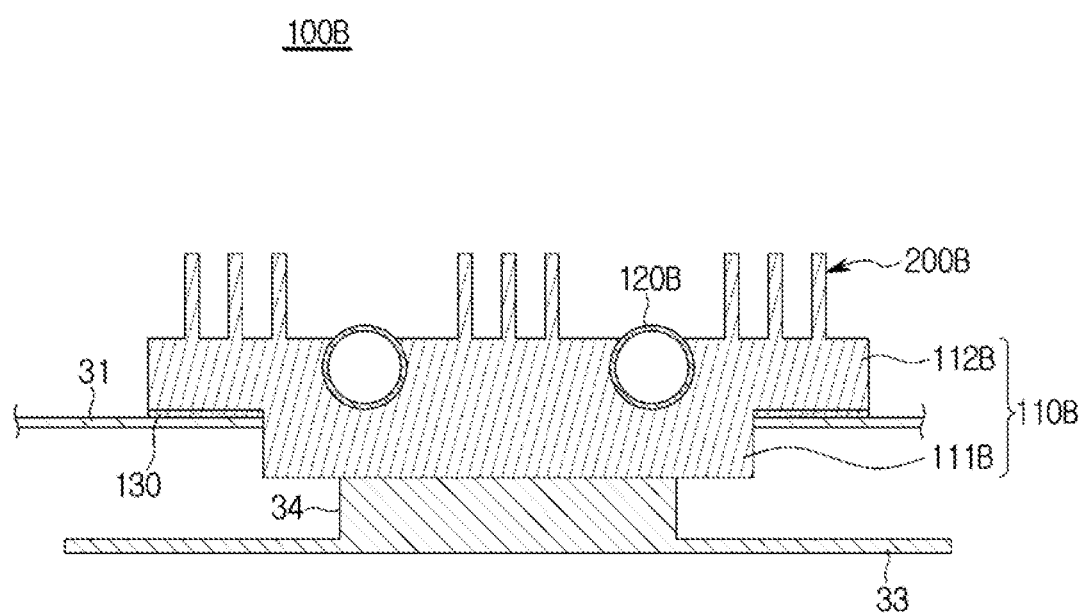
FIG. 12 is a cross-sectional view along line C-C' of FIG. 11.
Figure 13A:
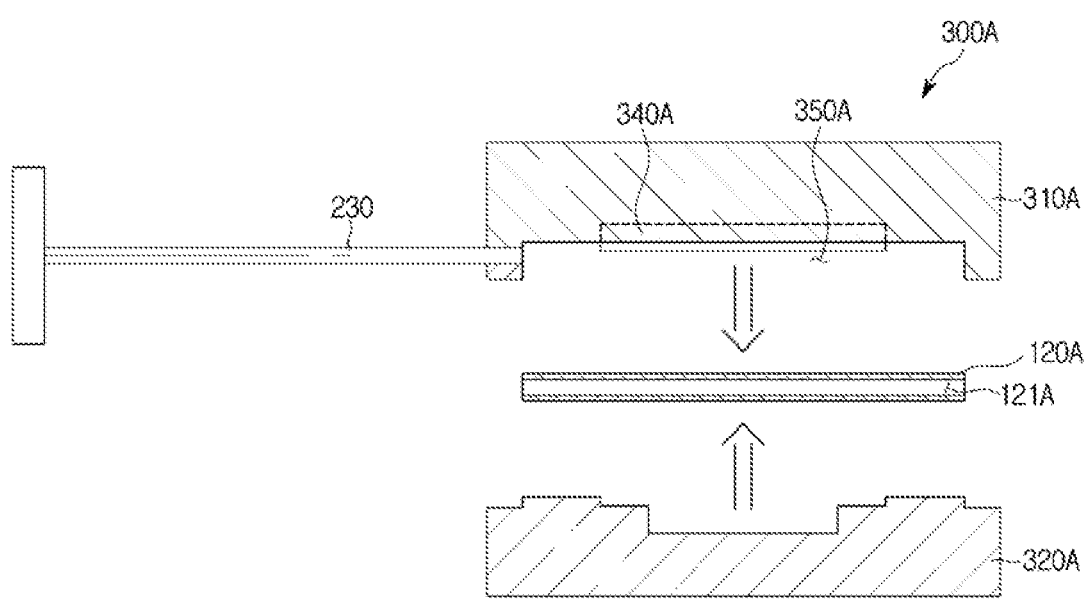
FIGS. 13A-13C and 14A-14C show procedures of manufacturing a cooling unit, according to another embodiment of the present disclosure.
Figure 13B:
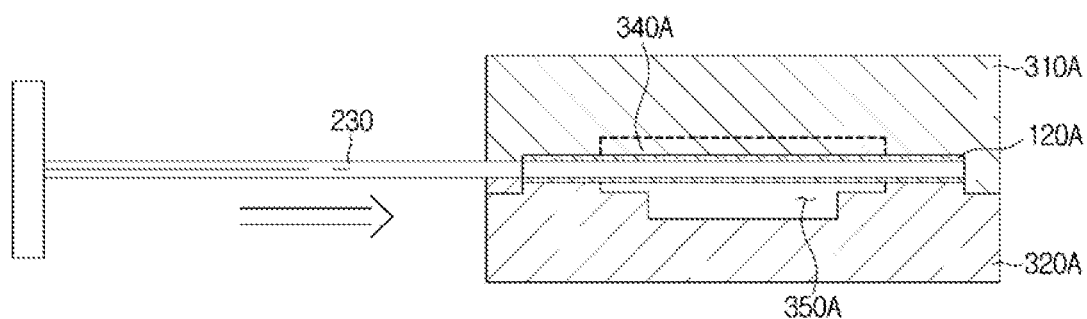
Figure 13C:
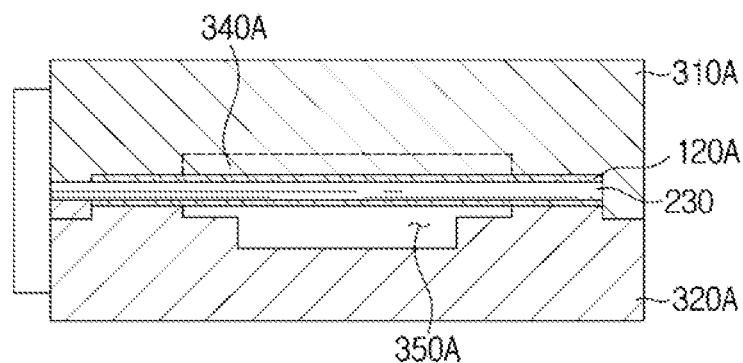
Figure 14A:
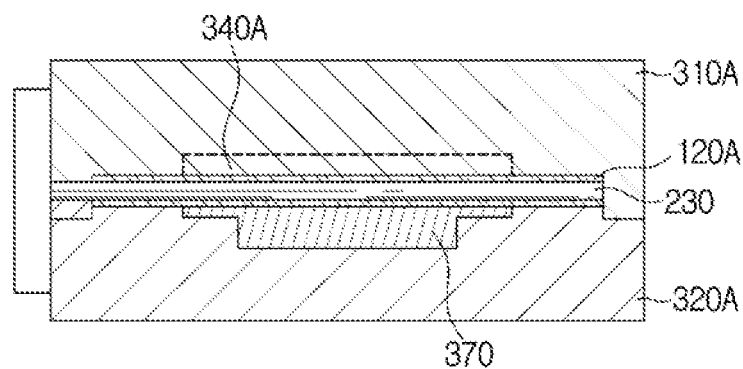
Figure 14B:
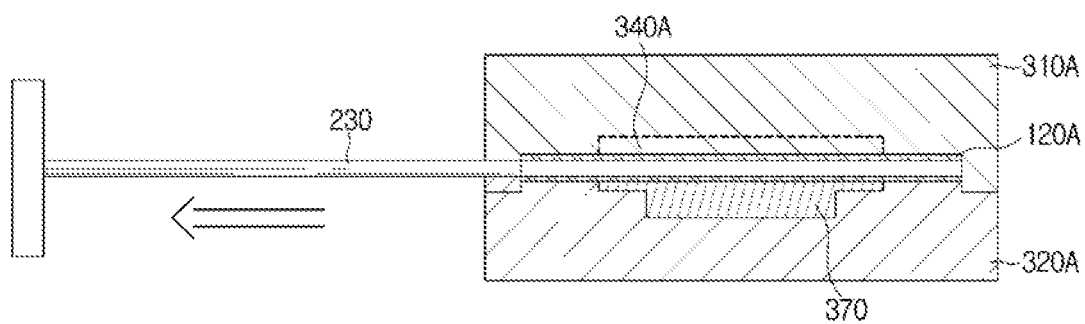
Figure 14C:
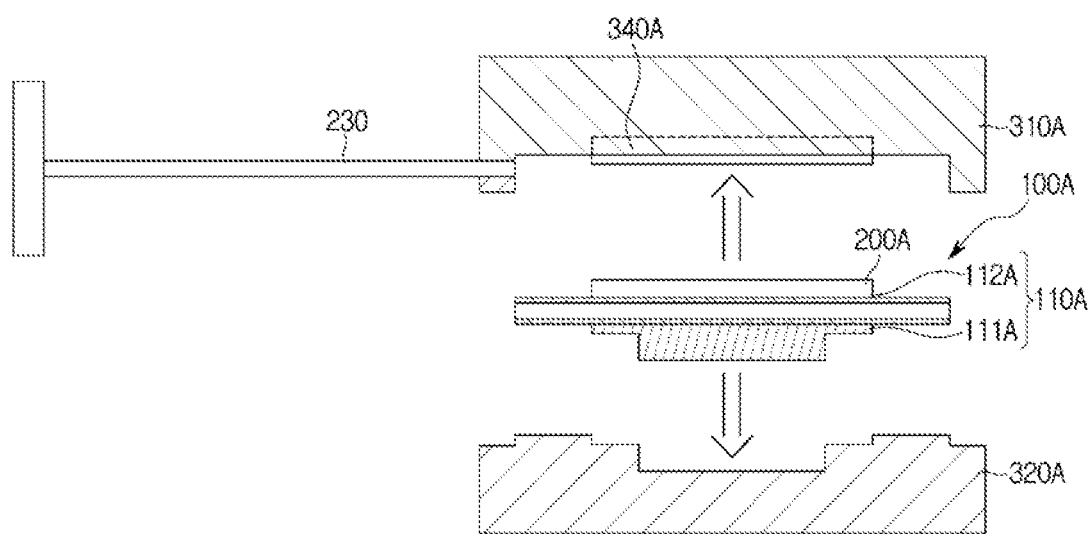

FIG. 11 is a perspective view illustrating a control box in which a cooling unit is installed, according to another embodiment of the present disclosure, FIG. 12 is a cross-sectional view along line C-C' of FIG. 11, and FIGS. 13A-C and 14A-14C show procedures of manufacturing a cooling unit, according to another embodiment of the present disclosure. Reference numerals not shown in FIGS. 11 to 14 may be referred to from FIGS. 1 to 8.

As shown in FIGS. 11 to 14, the cooling unit 100B may include a heat radiation member 110B, a cooling pipe 120B, and a heat transfer fin 200B.

At least a part of the cooling pipe 120B may be inserted into the heat radiation member 110B, and the heat transfer fin 200B may be arranged in a part of the heat radiation member 110B.

The heat radiation member 110B may include a first cooling unit 111B and a second cooling unit 112B. The first and second cooling units 111B and 112B of the heat radiation member 110B are members for forming a single body unit, and the second cooling unit 112B may be formed integrally with the first cooling unit 111B with at least a part of the cooling pipe 120B inserted into the single body unit.

The at least a part of the cooling pipe 120B may be exposed to the outside of the second cooling unit 112B. The second cooling unit 112B is formed to come into contact with the cooling pipe 120B in which the refrigerant flows to proceed heat exchange.

The heat transfer fin 200B formed on one side of the second cooling unit 112B may be located on the other side of the second cooling unit 112B, i.e., at a position opposite to the first cooling unit 111B. The heat transfer fin 200B is formed to exchange heat with air.

Accordingly, even when the refrigerant flows less in the cooling pipe 120B, at least a part of which is inserted into the second cooling unit 112B of the heat radiation member 110B, air cooling is achieved by the plurality of heat transfer fins 200B, thereby cooling the heating unit 34.

Since at least a part of the cooling pipe 120B is exposed to the outside of the heat radiation member 110B, the heat transferred from the heating unit 34 may be cooled down from the outside of the heat radiation member 110B, thereby increasing the cooling efficiency.

There may be a plurality of heat transfer fins 200B. The heat transfer fin 200B may be formed integrally with a part of the second cooling unit 112B. The heat transfer fin 200B may be manufactured in a die casting method in the second cooling unit 112B.

The heat transfer fin 200B may be formed of the same material as the second cooling unit 112B. The heat transfer fin 200B may include at least one of copper Cu, Aluminum Al, and iron Fe.

The heat transfer fin 200B may be placed on the other side of the second cooling unit 112B, i.e., at a position opposite to the first cooling unit 111B. The heat transfer fin 200B may be arranged on the outside of the case 31. The heat transfer fin 200B is formed to exchange heat with air.

Accordingly, even when the refrigerant flows less in the cooling pipe 120B, at least a part of which is inserted into the second cooling unit 112B of the heat radiation member 110B, air cooling is proceeded by the plurality of heat transfer fins 200B placed in the second cooling unit 112B, thereby cooling the heating unit 34.

A method for manufacturing the cooling unit 100B including the cooling pipe 120B, a part of which is formed to be exposed to the outside of the heat radiation member 110B, and the heat transfer fin 200B arranged in the second cooling unit 112B will now be described.

A die casting mold 300B includes an upper mold 310B and a lower mold 320B. The upper mold 310B and the lower mold 320B are combined together to form a cavity 350B therein.

The cavity 350B may include a former 340B formed to have a corresponding shape that allows the heat transfer fin 200B to be formed and at the same time, at least a part of the cooling pipe 120B to be exposed to the outside of the second cooling unit 112B.

Although in the embodiment of the present disclosure, the former 340B is formed for the at least a part of the cooling pipe 120B to be exposed to the heat radiation member 110B while the heat transfer fin 200B is formed integrally with parts of the heat radiation member 110B, the present disclosure is not limited thereto. For example, the heat transfer fin may be manufactured in the insert die casting method in the heat radiation member by being inserted into a die casting mold.

The cooling unit 100B may be manufacture by inserting the cooling pipe 120B into the die casting mold 300B, combining the guide pin 230 in the cooling pipe 120B, injecting a molten metal into the die casting mold 300B, and removing the guide pin 230 from the cooling pipe 120B.

Once the cooling pipe 120B is arranged in the cavity 350B, the guide pin 230 is combined in the cooling pipe 120B. Once the guide pin 230 is combined in the cooling pipe 120B, the molten metal 370B is injected into the cavity 350B of a form that encloses at least a part of the cooling pipe 120B. The molten metal 370B may include at least one of aluminum Al and aluminum alloy.

Once the molten metal 370B is injected into the cavity 350B, the guide pin 230 is removed from the inside of the cooling pipe 120B. That is, once the molten metal 370B is completely injected into the cavity 350B, the guide pin 230 may be removed.

In this regard, the guide pin 230 may be removed while the cooling pipe 120B is not deformed or damaged due to the molten metal 370B being injected into the cavity 350B.

Once the guide pin 230 is removed from the cooling pipe 120B, the manufactured cooling unit 100B may be separated from the die casting mold 300B.

Since the cooling pipe 120B may be formed with at least a part of it inserted into the heat radiation member 110B, it may increase an area of contact between the heat radiation member 110B and the cooling pipe 120B, thereby increasing heat exchange efficiency between the refrigerant flowing in the cooling pipe 120B and the heat radiation member 110B. In this case, since at least a part of the cooling pipe 120B is exposed to the outside of the heat radiation member 110B and cooled down by the air, the heat transferred from the heating unit 34 may be cooled down from the outside of the heat radiation member 110B, thereby increasing the cooling efficiency.

Furthermore, even when the refrigerant flows less in the cooling pipe 120B, air cooling is proceeded by the plurality of heat transfer fins 200B, thereby cooling the heating unit 34.

According to embodiments of an outdoor unit of an air conditioner and cooling unit applied to the outdoor unit, a heating unit may be efficiently cooled down.

Furthermore, heat exchange efficiency may be improved by increasing an area of contact between a heat radiation member for cooling the heating unit and a cooling pipe and increasing heat transfer effects by maintaining uniformity and adhesion of the contact through direct contact.

Moreover, with an air cooling heat transfer fin inserted in insert die casting, cooling efficiency may be increased by air cooling even if flowing of refrigerants decreases.

Cooling efficiency may also be increased by securing a fluid path without a loss in an amount of refrigerant flow, because there is no deformation of the cooling pipe nor a loss in an area of the inside of the cooling pipe.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An outdoor portion of an air conditioner comprising:
a case including a hole;
a compressor to compress a refrigerant;
a condenser to condense the compressed refrigerant discharged from the compressor;
a plurality of electronic parts arranged in the case and including a heater; and
a cooler arranged to cool at least some of the plurality of electronic parts,
wherein the cooler comprises:
a heat radiation member arranged to receive and cool down a heat produced from at least some of the plurality of electronic parts, and having a die-cast portion to come into contact with at least a part of a cooling pipe in which the refrigerant flows,
wherein the heat radiation member comprises a first cooler and a second cooler formed integrally with the first cooler and configured to transfer heat to the cooling pipe inside the second cooler, and
wherein the second cooler includes at least one combining hole and is installed on an outer side of the case by at least one combining member passing through the at least one combining hole to the outer side of the case, and the first cooler passes through the hole in the case to come into contact with the heater of the plurality of electronic parts.

2. The outdoor portion of the air conditioner of claim 1, wherein the cooler further comprises a plurality of heat transfer fins forming at least some part of the heat radiation member, and wherein at least one of the plurality of heat transfer fins is inserted into the heat radiation member in an insert die casting method.

3. The outdoor portion of the air conditioner of claim 1, wherein the first cooler has face-to-face contact with the heater for the electronic parts.

4. The outdoor portion of the air conditioner of claim 2, wherein the cooling pipe is entirely or partly inserted into the heat radiation member in a die casting method.

5. The outdoor portion of the air conditioner of claim 2, wherein the cooling pipe comprises at least one of copper (Cu), aluminum (Al), and iron (Fe).

6. The outdoor portion of the air conditioner of claim 2, wherein the heat radiation member comprises at least one of aluminum (Al) and an aluminum alloy.

7. The outdoor portion of the air conditioner of claim 1, further comprising:
an expansion valve to expand the refrigerant condensed by the condenser,
wherein the refrigerant passes through at least one of the condenser and the expansion valve.

8. The outdoor portion of the air conditioner of claim 2, wherein at least one of the plurality of heat transfer fins is formed integrally with the heat radiation member.

9. The outdoor portion of the air conditioner of claim 2, wherein at least one of the plurality of heat transfer fins comprises at least one of copper (Cu), aluminum (Al), and iron (Fe).

10. The outdoor portion of the air conditioner of claim 2, wherein at least one of the plurality of heat transfer fins is combined with the heat radiation member in an ultrasonic fusion method.

11. An outdoor portion unit of an air conditioner comprising:
a case including an opening;
a compressor to compress a refrigerant;
a condenser to condense a refrigerant discharged from the compressor;
a plurality of electronic parts arranged in the case and including a heater; and
a cooler provided on an outside of the case, extending through the opening of the case to the plurality of electronic parts, and arranged to cool the heater of the electronic parts,
wherein the cooler comprises:
a first cooler formed in die casting to extend through the opening to come into contact with the heater,
a second cooler formed integrally with the first cooler, including at least one combining hole, installed on an outer side of the case by at least one combining member passing through the at least one combining hole to the outer side of the case, and having a cooling pipe formed for the refrigerant to flow therein manufactured in an insert die casting method inside the first cooler, and
a plurality of heat transfer fins combined with the second cooler in at least one of die casting and insertion or ultrasonic fusion methods.

12. The outdoor portion of the air conditioner of claim 11, wherein the heat transfer fin comprises at least one of copper (Cu), aluminum (Al), and iron (Fe).

13. The outdoor portion of the air conditioner of claim 11, wherein the cooling pipe is die-casted to enclose all or part of the heat radiation member.

* * * * *